United States Patent [19]
Langelaan

[11] Patent Number: 5,870,106
[45] Date of Patent: Feb. 9, 1999

[54] COMPUTER GRAPHICS SYSTEM FOR MODELLING OBJECTS WHICH INCLUDE SEGMENTS THAT ARE BOUNDED BY LINEAR RADIAL AND ELLIPTICAL TANGENTIAL ELEMENTS

[76] Inventor: J. Willem R. Langelaan, 901 Parkland Avenue, Mississauga, Ontario, Canada, L5H 3G9

[21] Appl. No.: 732,810

[22] Filed: Oct. 15, 1996

[51] Int. Cl.$^6$ .................................................. G06T 11/20
[52] U.S. Cl. .................... 345/441; 345/442; 345/433; 345/438; 345/439
[58] Field of Search .................................. 345/441, 442, 345/433, 438, 439

[56] References Cited

U.S. PATENT DOCUMENTS

| | | | |
|---|---|---|---|
| 4,912,657 | 3/1990 | Saxton et al. | 345/356 |
| 5,010,502 | 4/1991 | Diebel et al. | 345/419 |
| 5,197,120 | 3/1993 | Saxton et al. | 345/439 |
| 5,265,197 | 11/1993 | Kondo | 345/420 |
| 5,268,997 | 12/1993 | Funaki | 345/427 |
| 5,390,294 | 2/1995 | Takeuchi | 345/441 |
| 5,412,762 | 5/1995 | Kondo | 345/420 |

*Primary Examiner*—Mark K. Zimmerman
*Assistant Examiner*—Albert K. Lee
*Attorney, Agent, or Firm*—Gowling, Strathy & Henderson

[57] ABSTRACT

A computer graphics system is disclosed. The system is for modelling parametric objects having elliptical segments, which are defined as segments bounded by linear radial and elliptical tangential elements. The system includes a retrieval and display function for an object having elliptical segments which have boundary surfaces that intersect at vertices and which have a common origin. The system includes a calculation of the location of the vertices relative to the common origin and evaluates and discards invalid vertices. The system also calculates the boundary surfaces of individual elliptical segments, defined by valid vertices. Output is provided in the form of dimensionally accurate and geometrically undistorted digital models. In one embodiment the system is useful in designing elliptical elements for doors, windows and the like in an architectural drafting program.

9 Claims, 10 Drawing Sheets

COMPUTER GRAPHICS SYSTEM FOR MODELLING OBJECTS WHICH INCLUDE SEGMENTS THAT ARE BOUNDED BY LINEAR RADIAL AND ELLIPTICAL TANGENTIAL ELEMENTS

FIELD OF THE INVENTION

The present invention relates generally to computer aided graphics systems, such as computer aided design (CAD) or computer aided manufacturing (CAM) systems. More specifically the invention relates to computer graphic systems capable of modelling parametric objects.

BACKGROUND OF THE INVENTION

It is a time consuming process to construct in 2D or in 3D space a graphical representation of an object which includes elliptical segments. Elliptical segments are segments bounded by linear radial elements and elliptical tangential elements. Linear radial elements are rectilinear elements that extend out from a common origin like spokes in a wheel. Elliptical tangential elements are curved elements whose curvature follows an elliptical path like a frame of an elliptical mirror. Elliptical segments may be part of complex elliptical designs for example used in architecture for door windows, windows or other applications.

At present, to generate an image incorporating elliptical segments requires that the segments be calculated and then drawn either on paper or on a computer. However, the image so created is specific to the attributes which are given (length, width, number of elements and the like), and cannot be used except with such attributes. Changing any value of the attributes of the segments such as number or width of linear radial elements, number, width or ellipticity of elliptical tangential elements usually requires redrawing the entire image of the elliptical segments.

To alleviate this problem computer graphics systems sometimes include a database with geometric data for a finite number of pre-constructed instances of objects with elliptical segments. The usability of such graphics systems remains limited to the selection of those instances which are stored in the database. Changing the total width or length of such a pre-constructed object typically will result in anamorphism which the user cannot correct. Such anamorphism, in the context of a computer graphics system for design, such as an architectural modelling program, is clearly unacceptable, because of the loss of dimensional accuracy and the geometric distortion which results.

SUMMARY OF THE INVENTION

What is required, is to provide a generalized, parametric object whose geometric attributes have values that are enforced in the output. Most preferably, the user should be able to specify and set attribute values so the user can efficiently design and re-design a nearly unlimited variety of dimensionally and topologically specific solutions.

This invention relates to a method for generating representations of objects that are bounded by linear radial and elliptical tangential elements. The segments are derived from an orthogonal transformation of a radially and tangentially segmented circle. The segments may be grouped together to form a segmented section. To be dimensionally accurate and devoid of anamorphism, the segmented section must retain its encapsulated and/or user specified attribute values after an orthogonal transformation. For example the width of radial elements and the width of tangential elements must remain constant for any variations of the elliptical section's width to length aspect ratios that result from the design process.

It is an object of the present invention to provide a computer graphics system that can solve the drawbacks of known prior systems and can provide improved modelling for designing and prototyping efficiencies.

Another and more specific object of the present invention is to provide a computer graphics system that provides the user with a generalization of the geometry of segments which are bounded by linear radial and elliptical tangential elements, which the user can transform into a nearly unlimited number of dimensionally and topologically specific solutions.

A further object of the invention is to provide a computer graphics technology that supports the efficient design of objects that include segments which are bounded by linear radial and elliptical tangential elements. For example, it is an object of the system to enable an interactive cyclical design process of:

inputting the segmented section's attribute values;

receiving 2D or 3D visual feedback;

evaluation of the representation presented; and editing the segmented section's attribute values to produce a further more desirable representation.

In order to accomplish the afore-mentioned and other objects, a system for generating 2D or 3D representations of objects that include segments which are bounded by linear radial and elliptical tangential elements according to the present invention, includes an input means for entering the position, orientation and attribute values of the object. The system may also include geometric evaluation and simplification methods based on shape grammars. Shape grammars are a set of rules to evaluate and specify geometric relationships. For example the preferred invention checks that no invalid geometries occur. If these are detected shape grammars simplify the geometry.

Therefore, according to the present invention, there is provided a computer graphics system for modelling parametric objects having elliptical segments, said system comprising:

a means to retrieve and display an object having elliptical segments, said elliptical segments having boundary surfaces which intersect at vertices, and have a common origin;

a means to calculate a location of vertices relative to said common origin;

a means to evaluate said calculated locations and to discard invalid vertices; and a means to calculate the boundary surfaces of individual elliptical segments defined by valid vertices, to create a digital model of said object to provide dimensionally accurate and geometrically undistorted output.

Figure 3:
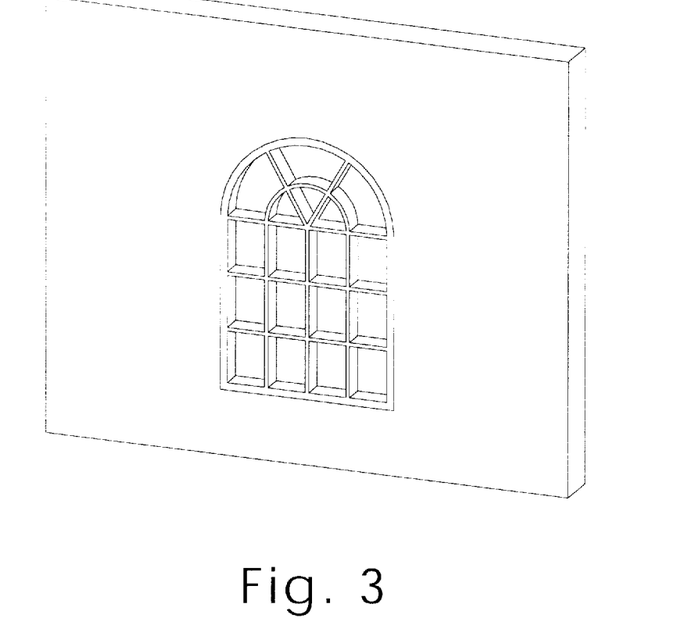
FIG. 3 is an example of a window assembly having a segmented section according to the present invention.

The segmented section may receive attribute values from constituent components of the object, FIG. 3.

Figure 4:
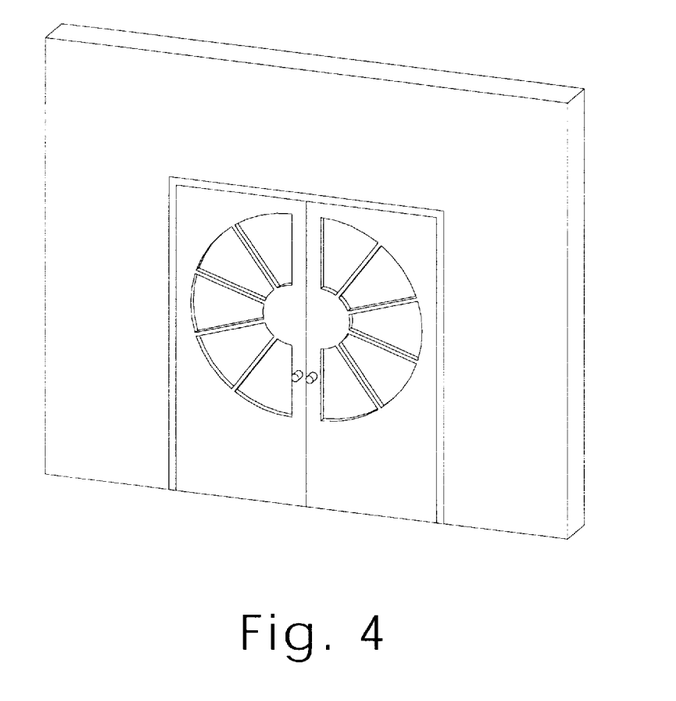
FIG. 4 is an example of a door having a segmented section according to the present invention.

The field of application for this method includes but is not limited to computer supported modelling of: windows FIG. 3, transom windows, door windows FIG. 4, tree grates, grates, wheels, pulleys, hubcaps, manhole covers, ornaments, etc.

BRIEF DESCRIPTION OF THE DRAWINGS

Reference will now be made to the following figures which illustrate, by way of example only, preferred embodiments of the present invention and in which.

DETAILED DESCRIPTION OF THE PREFERRED EMBODIMENTS

Before describing the specifics of the present invention, it is helpful to provide some general definitions, which are applicable to this specification. This invention is directed to a computer graphics system for modelling parametric objects having elliptical segments. All references to elliptical segments includes a reference to segments that are bounded by linear radial and elliptical tangential elements. Linear radial elements are rectilinear elements that extend out from a common origin like spokes in a wheel. Elliptical tangential elements are curved elements whose curvature follows an elliptical path like a frame of an elliptical mirror. All references to segmented elliptical sections indicate a reference to a group of elliptical segments with a common geometric origin. In this disclosure, all geometric descriptions are relative to an orthogonal Cartesian computer coordinate system. The local coordinate system of the elliptical section may be rotated or translated. All references to the abscissa are also true for the ordinate and vice versa unless noted otherwise. The abscissa and ordinate derive their dimensional relationship from the width to length aspect ratio of the major and minor radius of the elliptical section. All references to "inner" and "outer" indicate proximity relative to the geometric origin of the linear radial and elliptical tangential element coordinating surfaces, where "inner" is closer to the geometric origin than "outer". For consistency in each Figure, similar elements are referred to with like numerals, unless noted otherwise.

The field of application for this method includes but is not limited to computer supported modelling of: windows such as shown in FIG. 3, transom windows, door windows such as shown in FIG. 4, tree grates, grates, wheels, pulleys, hubcaps, manhole covers, ornaments, and other objects including elliptical segments or sections.

Figure 1:
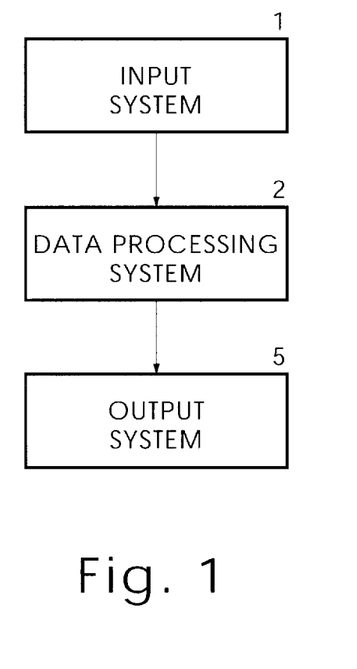
FIG. 1 is a block diagram showing a schematic arrangement of the preferred embodiment of a computer graphic modelling system of the present invention.

FIG. 1 is a block diagram showing a schematic arrangement of a computer graphics modelling system of the present invention. The system includes an input sub-system 1, a data processing sub-system 2 that may comprise a computer, and an output sub-system 5 as described more fully below. It will be appreciated by those skilled in the art, and from the following descriptions that some of the processes in the data processing system can be realized by software and executed by a central processing unit such as, for example, a server, a work station or a personal computer.

Figure 2:
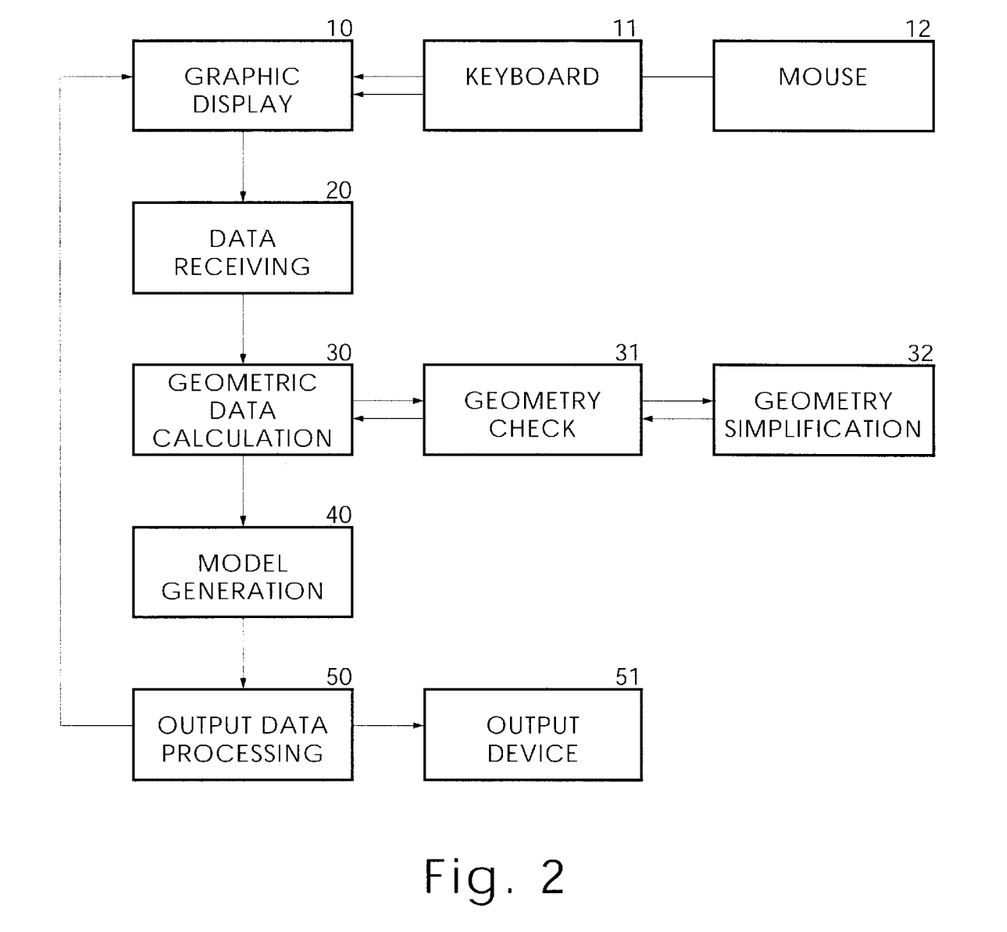
FIG. 2 is a block diagram showing a schematic arrangement of the sub-systems of the preferred embodiment of the computer graphic modelling system of FIG. 1.

FIG. 2 is a block diagram showing the schematic arrangement of FIG. 1 at a more detailed system level which illustrates elements of the three sub-systems shown in FIG. 1.

The data input sub-system 1 may consist of, but is not limited to, the following elements, a graphic display unit 10, such as a monitor, and data input devices such as a keyboard 11, and a mouse 12. The purpose of the data input subsystem is to allow data to be input into the system to facilitate real time design of the objects being designed.

The computer graphics system according to the present invention has an input and an output mode. A graphic display unit 10 displays input and output environments, for example through a window with information about an object that the user has already retrieved from a data base. These environments can be alternately or concurrently displayed on the screen of the graphic display unit. In input mode the user may configure an instance of the retrieved object which includes elliptical segments by editing attribute values. The object's parameters define an instance of the object. The parameters comprise the object's geometric attributes and attribute values. Thus, a given parameter set may comprise four parameter sub-sets:

parameters with attribute values that can be specified and edited by the user;

parameters with encapsulated attribute values that cannot be directly edited by the user;

parameters with attribute values that result from data exchange with other components of the object; and parameters with attribute values that result from data exchange with other objects in the computer graphic system's database.

With respect to attribute values that can be set by the user the preferred manner is to provide an input mode in which values can be entered with the keyboard 11 and/or the mouse 12 and/or graphics tablet and/or other means of transferring input values. The preferred computer graphics system displays the entered or input values on the graphic display unit 10. In a preferred output mode a graphical representation in conformity with the entered input values can be displayed.

The data processing sub-system 2 consists of the following elements:

a data receiving sub-system 20;

a geometric data calculation sub-system 30; and a model generation sub-system 40.

In the data receiving sub-system 20 the attribute values are evaluated by comparing them to ensure that no impossible geometries are proposed. If errors are detected, a warning message may be displayed on the graphic display. Each object has an origin, which is defined by the object syntax at the time the object is first stored in the data base. The object origin is used in conventional programs to locate the objects in the Cartesian coordinate system of the computer data base. A geometric origin 100 (FIGS. 5 to 8) of the elliptical segments is calculated and a translation vector from the object's origin to the geometric origin is calculated and stored. This will be used, if necessary, to ensure the modified object is correctly located in the Cartesian coordinate system. The geometric origin 100 of the segmented elliptical section is located at an intersection of coordinating planes 80 (FIG. 5) of the radial elements and the major and minor axis 110, 120 of the elliptical tangential elements.

FIGS. 5 to 8 are illustrations of different elliptical sections.

Figure 5:
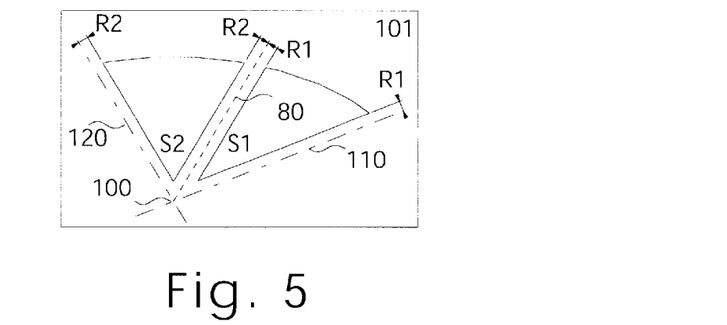
FIG. 5 is an orthographic projection of a rectangular object with a rotated segmented elliptical section which shows a geometric origin of the segmented elliptical section.

FIG. 5 is an illustration of the relative location of a geometric origin 100 of a rotated elliptical section which comprises elliptical segments S1 and S2 which is part of a rectangular object 101. Also shown are the major radius 110 and the minor radius 120. A linear radial coordinating surface is shown as 80. Coordinating margins are shown as R1 and R2 for segments S1 and S2 respectively. In the most preferred form of the invention, the margins on each side of each segment are the same and thus are identified by the same identifier ie. R1. In some cases however it may be possible to utilize different margins without departing from the present invention.

Figure 6:
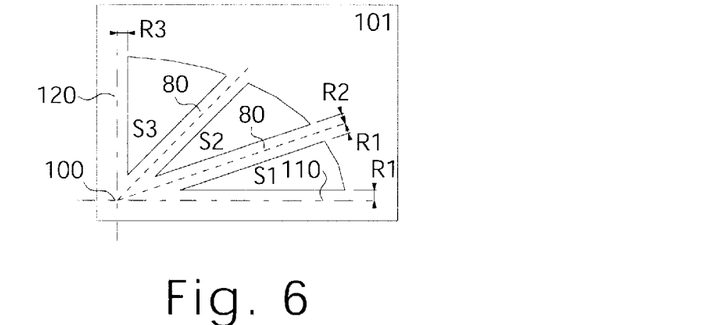
FIG. 6 is an orthographic projection of a rectangular object with a segmented quarter elliptical section which shows a geometric origin of the quarter elliptical section.

FIG. 6 is an illustration of the relative location of the geometric origin 100 of a segmented quarter elliptical section which comprises elliptical segments S1, S2 and S3 which is part of the rectangular object 101.

Figure 7:
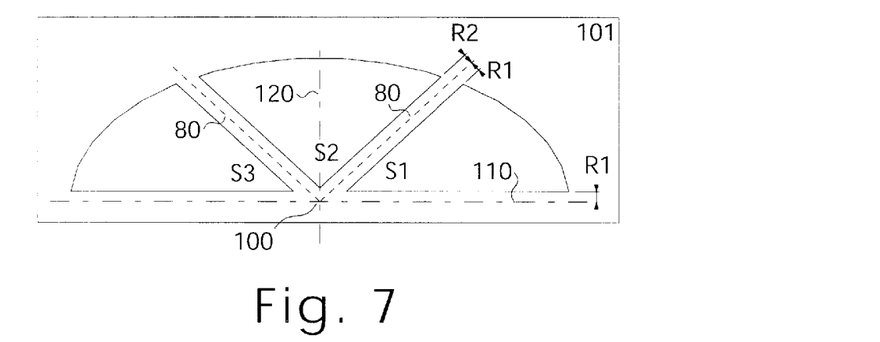
FIG. 7 is an orthographic projection of a rectangular object with a segmented half elliptical section which shows a geometric origin of the half elliptical section.

FIG. 7 is an illustration of the relative location of the geometric origin 100 of a segmented half elliptical section which comprises elliptical segments S1, S2 and S3 which is part of the rectangular object 101.

Figure 8:
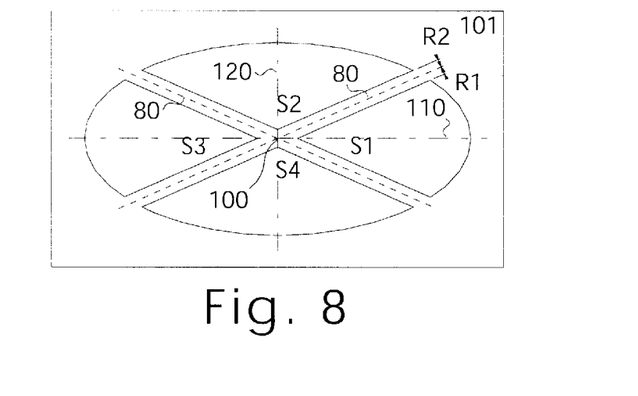
FIG. 8 is an orthographic projection of a rectangular object with a segmented full elliptical section which shows a geometric origin of the full elliptical section.

FIG. 8 is an illustration of the relative location of the geometric origin 100 of a segmented full elliptical section which comprises elliptical segments S1, S2, S3 and S4 which is part of the rectangular object 101.

In the geometric data calculation sub-system 30 (of FIG. 2) geometric data is calculated and stored in a database for processing in the model generation sub-system 40. Two sets of geometric data are calculated:

geometric data for the geometry of the object excluding the segmented elliptical section; and geometric data of the object's elliptical segments. For example, referring to FIG. 13, the first set of data would be the perimeter 75 and the second set of data would be the elliptical segments.

Figure 9:
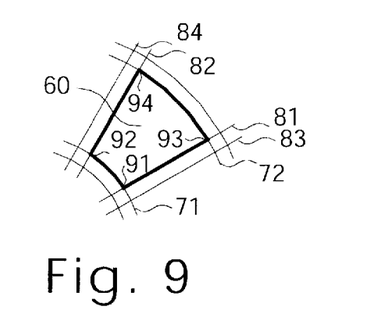
FIG. 9 is an example of an elliptical segment with four boundary surfaces.
Figure 10:
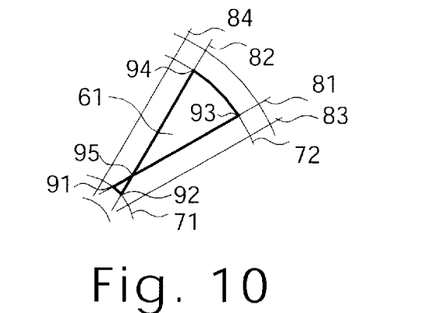
FIG. 10 is an example of an elliptical segment with three boundary surfaces.
Figure 11:
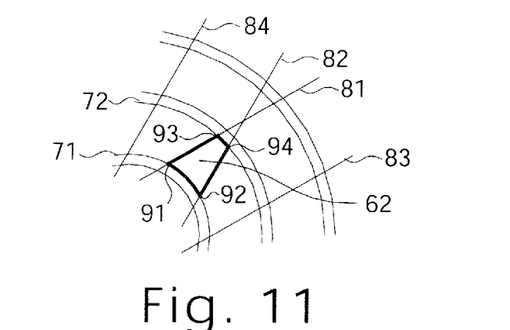
FIG. 11 is an example of a geometrically invalid elliptical segment.

FIG. 9, FIG. 10, FIG. 11 and FIG. 12 are illustrations of a topology of four elliptical segments:

In FIG. 9, an elliptical segment 60 is shown with four boundary surfaces 71, 72, 81 and 82 and four vertices 91, 92, 93 and 94;

In FIG. 10, an elliptical segment 61 is shown with three boundary surfaces 72, 81 and 82 and three vertices 95, 93 and 94;

In FIG. 11, a geometrically invalid elliptical segment 62 is shown resulting from coinciding radial elements. The one radial element has boundary surfaces 81 and 83, and the other has boundary surfaces 82 and 84.

Figure 12:
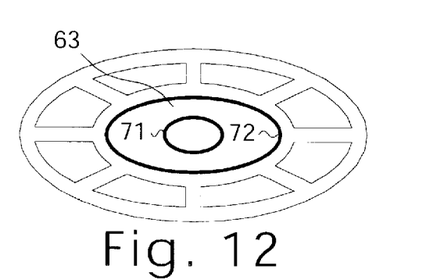
FIG. 12 is an example of a toroidal elliptical segment with two boundary surfaces.

In FIG. 12, a toroidal elliptical segment 63 with two boundary surfaces 72 and 71 and no vertices is shown.

It will now be appreciated that if the radius of the solid core 71 is zero the elliptical segment 63 is an ellipse with only one boundary surface 72. However, this is not illustrated.

Figure 13:
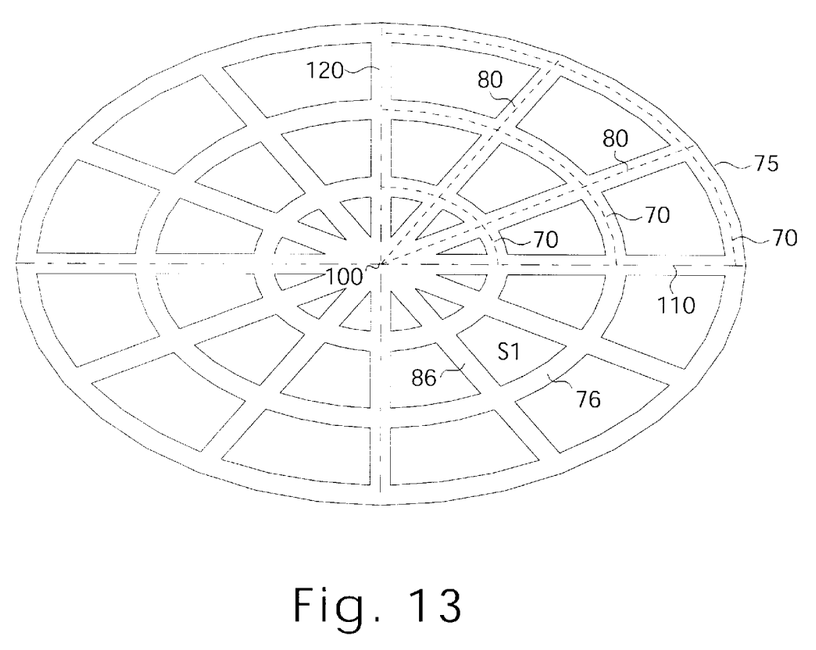
FIG. 13 is an orthographic projection of an elliptical section and includes linear radial and elliptical tangential coordinating surfaces.

Turning now to FIG. 13 there is provided an illustration and object which includes segments that are bounded by linear radial elements such as 86 and elliptical tangential elements such as 76. Also shown are of the coordinating surfaces 70, 80, 110 and 120 which can bound elliptical segments such as S1. These coordinating surfaces are respectively the elliptical tangential surface 70, the linear radial surfaces 80 and major and minor radii, 110 and 120. The ellipticity of the elliptical tangential coordinating surfaces is proportional to the aspect ratio of the major radius 110 and the minor radius 120.

Figure 14:
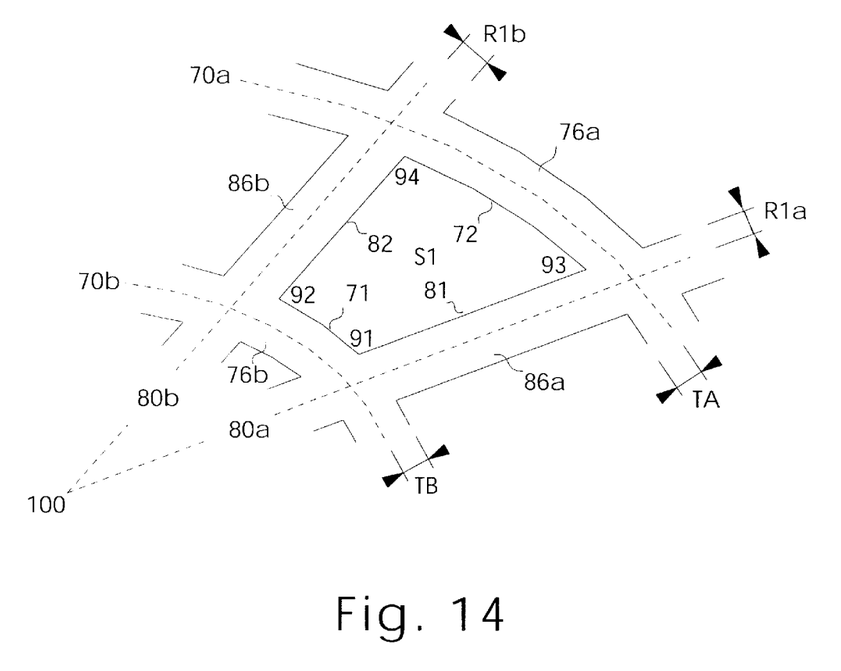
FIG. 14 is an orthographic projection of an elliptical segment of FIG. 13 and includes linear radial and elliptical tangential coordinating surfaces.

FIG. 14 is an illustration of the relative location of a number of boundary surfaces and vertices of an elliptical segment S1.

In this Figure, TA is the margin between the outer elliptical tangential coordinating surface 70a and the outer elliptical tangential boundary surface 72 of the elliptical segment. As illustrated, and in all cases Margin TA$\geq$0.

TB is the margin between the inner elliptical tangential coordinating surface 70b and the inner elliptical tangential boundary surface 71 of the elliptical segment S1. As illustrated, and in all cases Margin TB$\geq$0.

R1a and R1b are the margins between the linear radial coordinating surfaces 80a and 80b and the linear radial boundary surfaces 81 and 82 of the elliptical segment S1 respectively. In all cases Margins R1a and R1b$\geq$0. Elliptical segments bounded by other sets of linear radial coordinating surfaces may have different margins R2, R3 etc., and in all cases such margins R2, R3 will be $\geq$0.

Figure 15:
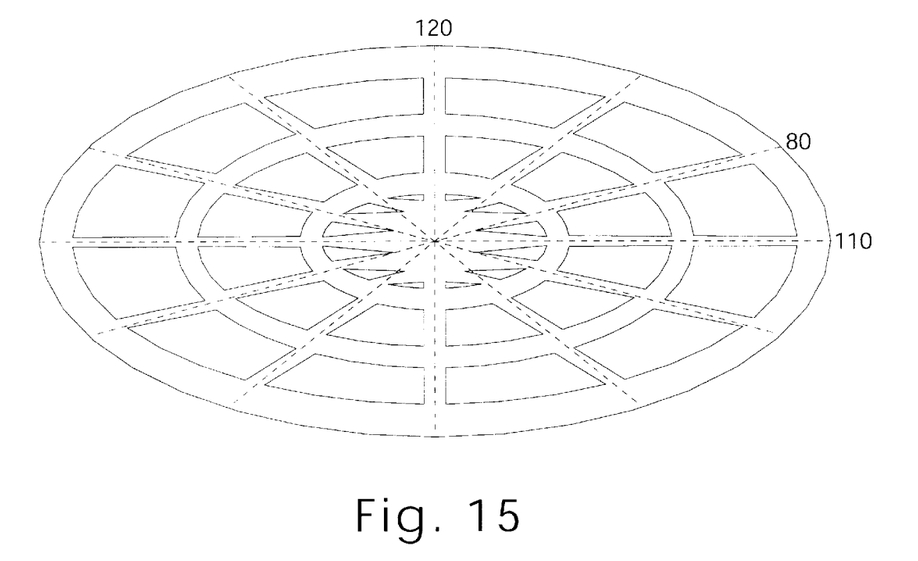
FIG. 15 is an orthographic projection of an elliptical section segmented by radial and tangential elements exclusive of a process to compensate for anamorphism.
Figure 16:
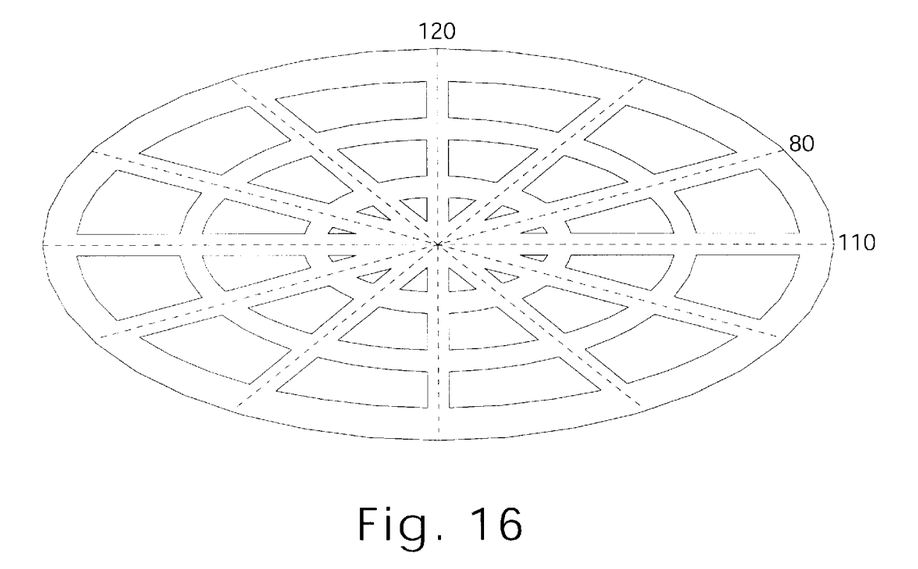
FIG. 16 is an orthographic projection of an elliptical section segmented by radial and tangential elements inclusive of a process to compensate for anamorphism according to the present invention.

FIG. 15 illustrates that the anamorphism which is the result of the geometric contradiction of ellipticity and the topology of the linear radial and elliptical tangential elements. The geometric data calculation of the present invention eliminates this anamorphism. If the elliptical segment is not toroidal or an ellipse then the geometric data calculation 30 process of an elliptical segment consists of two calculation operations. These calculations are necessary to maintain orthotropics for the radial boundary surfaces of the elliptical segments and the results are shown in FIG. 16.

Returning to FIG. 14, the first calculation operation calculates a compensated angle for radial vectors from the geometric origin 100 to the vertices 93 and 94. The vertices 93 and 94 are the intersections of the two boundary surfaces 81 and 82 of the linear radial elements 86a and 86b with the boundary surface 72 of the outer elliptical tangential element 76a. A geometry check 31 evaluates that the angle of the radial vector to vertex 93 is less than the angle of the radial vector to vertex 94. If not, as can now be appreciated the elliptical segment is a geometrically invalid segment as shown in FIG. 11 as 62. If the angles pass the evaluation the geometric data of the connecting elliptical arc segment between vertices 93 and 94 are calculated and stored and the second phase of the geometric data calculation starts. If not, the geometry simplification process 32 deletes the geometric data to omit the elliptical segment (as an invalid segment) and instructs the geometric data calculation 30 to resume with the first phase of the geometric data calculation for the next elliptical segment.

The second geometric data calculation phase calculates the compensated angle of the radial vector to vertices 91 and 92 from the geometric origin. The vertices 91 and 92 are the intersections of the two boundary surfaces 81 and 82 of the linear radial elements 86a and 86b with the boundary surface 71 of the inner elliptical tangential element 76b. The geometry check 31 evaluates that the angle of the radial vector to vertex 91 is less than the angle of the radial vector to the vertex 92. If not, the elliptical segment has three boundary surfaces and three vertices as segment 61 shown in FIG. 10. If the angles pass the evaluation the geometric data of the connecting elliptical arc segment between vertices 91 and 92 are calculated and stored. This completes the geometric data of the elliptical segment and the first phase of the geometric data calculation for the next elliptical segment begins. If the radial vector angle does not pass the evaluation, the geometry simplification process 32 deletes the vertices 91 and 92 and calculates a compensated angle of the radial vector to an inner vertex 95 (FIG. 10). The inner vertex 95 is the result of the intersection of the two boundary surfaces 81 and 82. The coordinates of the vertex 95 are stored. This completes the geometric data of the elliptical segment and the geometry calculation of the elliptical segments proceeds to calculate the first phase for the next elliptical segment of the object.

If the elliptical segment is toroidal 63 or an ellipse (if the solid core is omitted the elliptical segment is an ellipse with one boundary segment) then the geometric data of the outer boundary surface of the ellipse 72 are calculated and stored and the second geometric data calculation phase starts. If an inner ellipse 71 (FIG. 12) is present, its geometric data are also calculated and stored.

The model generation sub-system 40 uses the stored geometric data of the object and its elliptical segments to generate a 2D or 3D model, and may calculate a projection of the entire model or of a detail. In addition the projection may include but is not limited to attributes for colour, texture mapping, shadow casting, light emission, transparency, luminosity, or other features of illustration as are known to those skilled in the art.

Turning back to FIG. 2, the output system 5 consists of the following elements:
 output data processing sub-system 50,
 graphic display unit 10,
 output devices 51.
  In the output data processing sub-system 50 the projected model and its attributes are compiled into a format which is suitable for interpretation by the output device.

The output devices 51 may consist of, but are not limited to a graphic display, a printer, a plotter, an NC machining or manufacturing device, a stereo lithographer, a data storage system, or the like.

Figure 17:
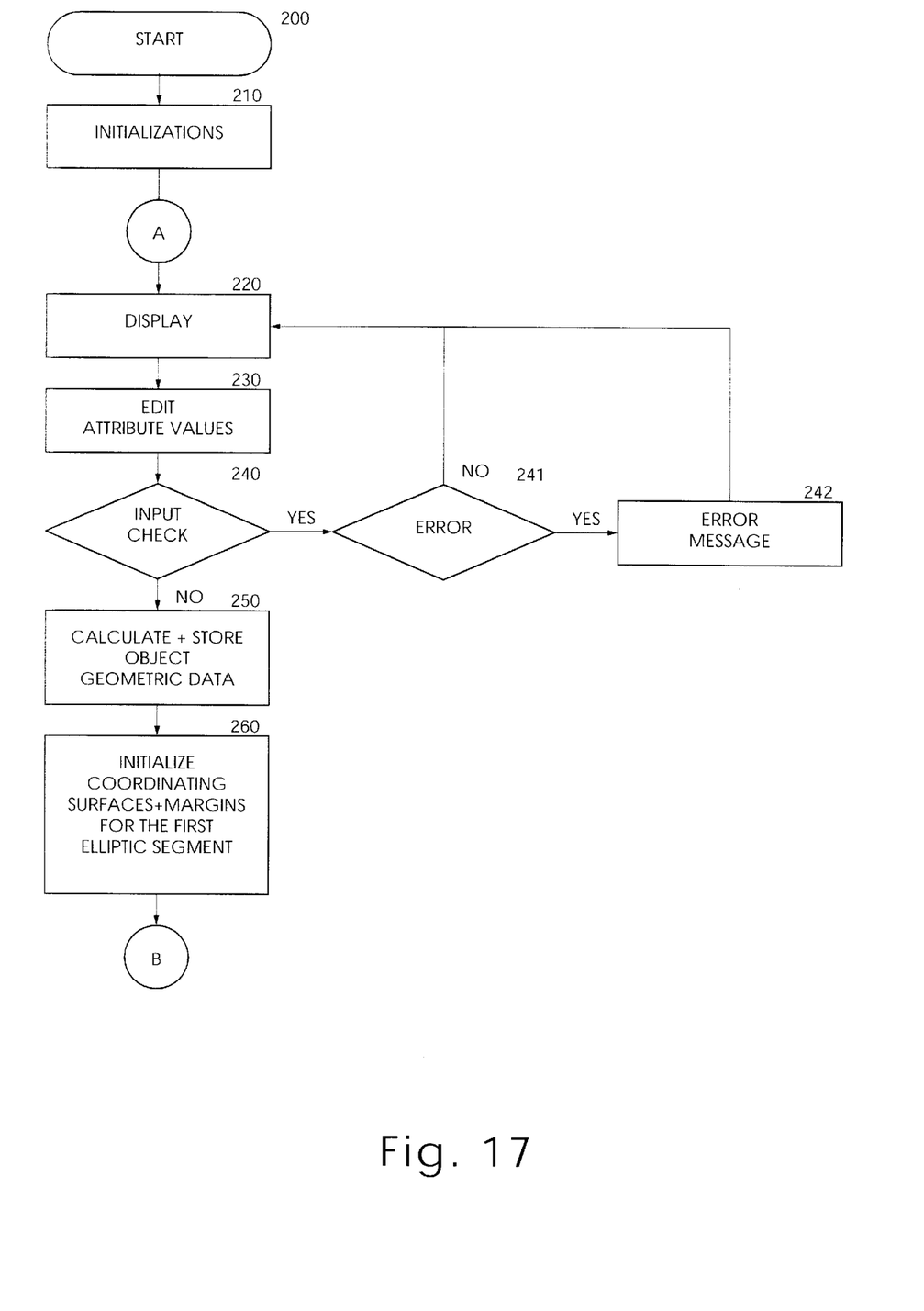
FIG. 17 is a schematic flowchart for a method for modelling an object which includes segments that are bounded by linear radial and elliptical tangential elements according to the present invention.
Figure 18:
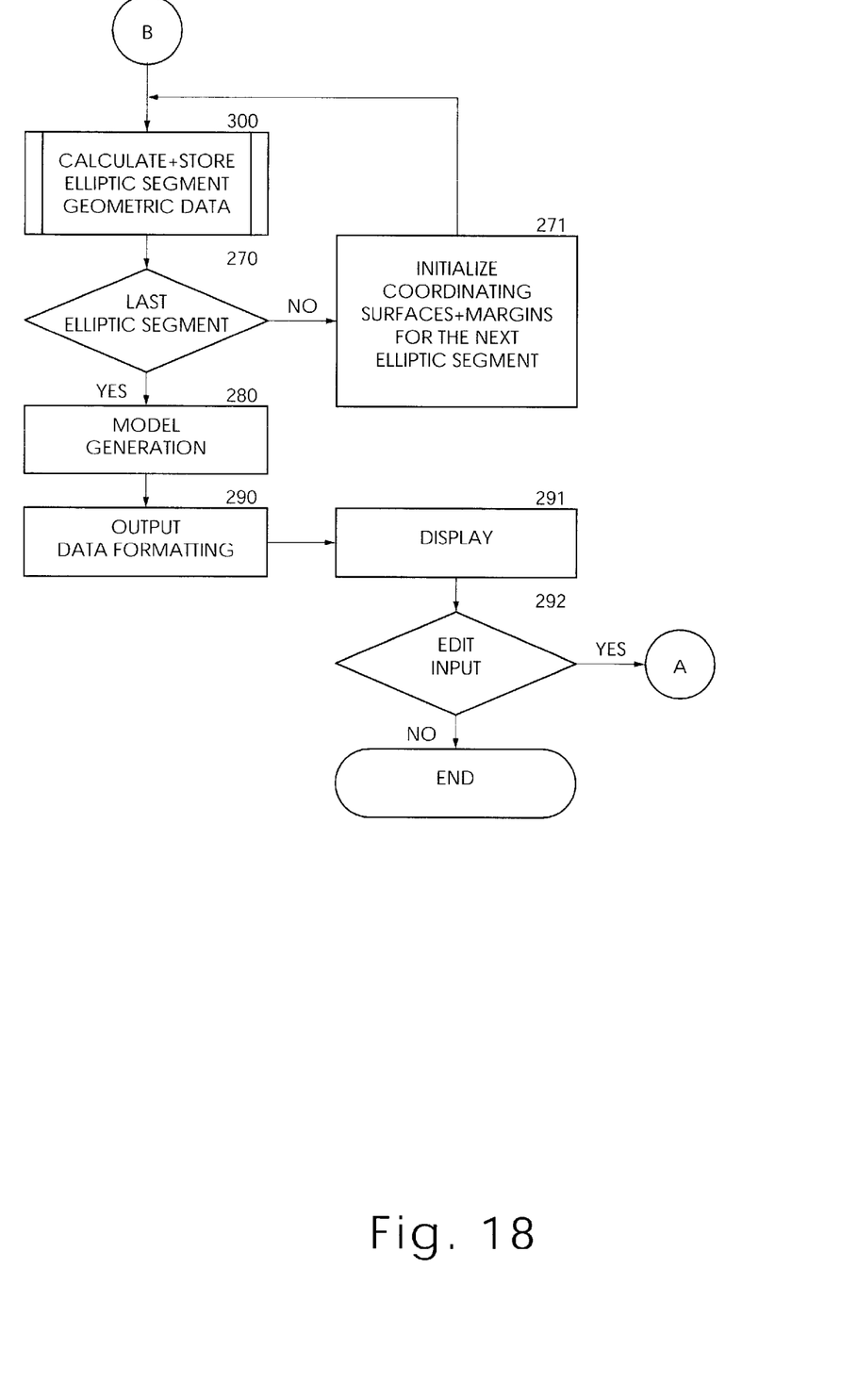
FIG. 18 is a continuation of the flowchart of FIG. 17.

FIG. 17 and its continuation in FIG. 18 is a schematic flowchart for modelling an object which includes segments which are bounded by linear radial and elliptical tangential elements according to the present invention. Each of the method steps are described in more detail below.

Step 210, represents the retrieval of an object and its user interface, which may include a display of attribute values for the object.

Step 220, represents the step of displaying the user interface on the graphic display screen.

Step 230, represents the step of a user entering and/or editing attribute values for the object.

In step 240, there is provided an initial input checking step to ensure attribute values describe a real (and not impossible) geometry, after which the dataflow continues at step 241. If there is not such a calculation, then one proceeds to step 250.

In step 241, the attribute values are checked and if an error is detected then the dataflow continues to step 242. If no error is detected, then the method proceeds to step 220.

In step 242, an error message is initialized and displayed on the graphic display screen. This will prompt the user to check and reenter attribute values which are possible.

In step 250, (since the object has already been checked to be geometrically possible) the geometric data of the object, excluding the elliptical section, is calculated and stored.

In step 260, the process retrieves and/or calculates for the first elliptical segment the following set of information:
 the angle, relative to the origin 100, of the linear radial coordinating surfaces 80a and 80b;
 the major 110 and minor 120 radii of the elliptical coordinating surfaces 70; and
 the margins R of the radial and the margins T tangential boundary surfaces.

FIG. 18 is the continuation of the schematic flowchart from FIG. 17, and begins with a step 300.

In the step 300, the elliptical segment's geometric data is calculated and stored. The dataflow of this step is explained in more detail below in association with FIG. 19.

In step 270, if the geometric data is calculated for the last elliptical segment then the dataflow continues to step 280. If not, then it proceeds to a step 271.

In the step 271, the program retrieves and/or calculates for the next elliptical segment,
 the angle, relative to the origin 100, of the linear radial coordinating surfaces 80a and 80b;
 the major 110 and minor 120 radii of the elliptical coordinating surfaces 70; and
 the margins R of the radial and the margins T tangential boundary surfaces.

The dataflow continues to step 300.

Once all the segments have had their geometric data calculated, the program proceeds to step 280. Upon completion of the calculation of the geometric data for all elliptical segments, all geometric data is retrieved and merged with syntactic element(s) of the CAD system to model an object with a segmented elliptical section.

In step 290, the model data is compiled for display and/or for use by other output devices.

In step 291, the model is displayed on the graphic display.

In step 292, if the model requires editing of the object then the dataflow continues at step 220 else the method is terminated.

Figure 19:
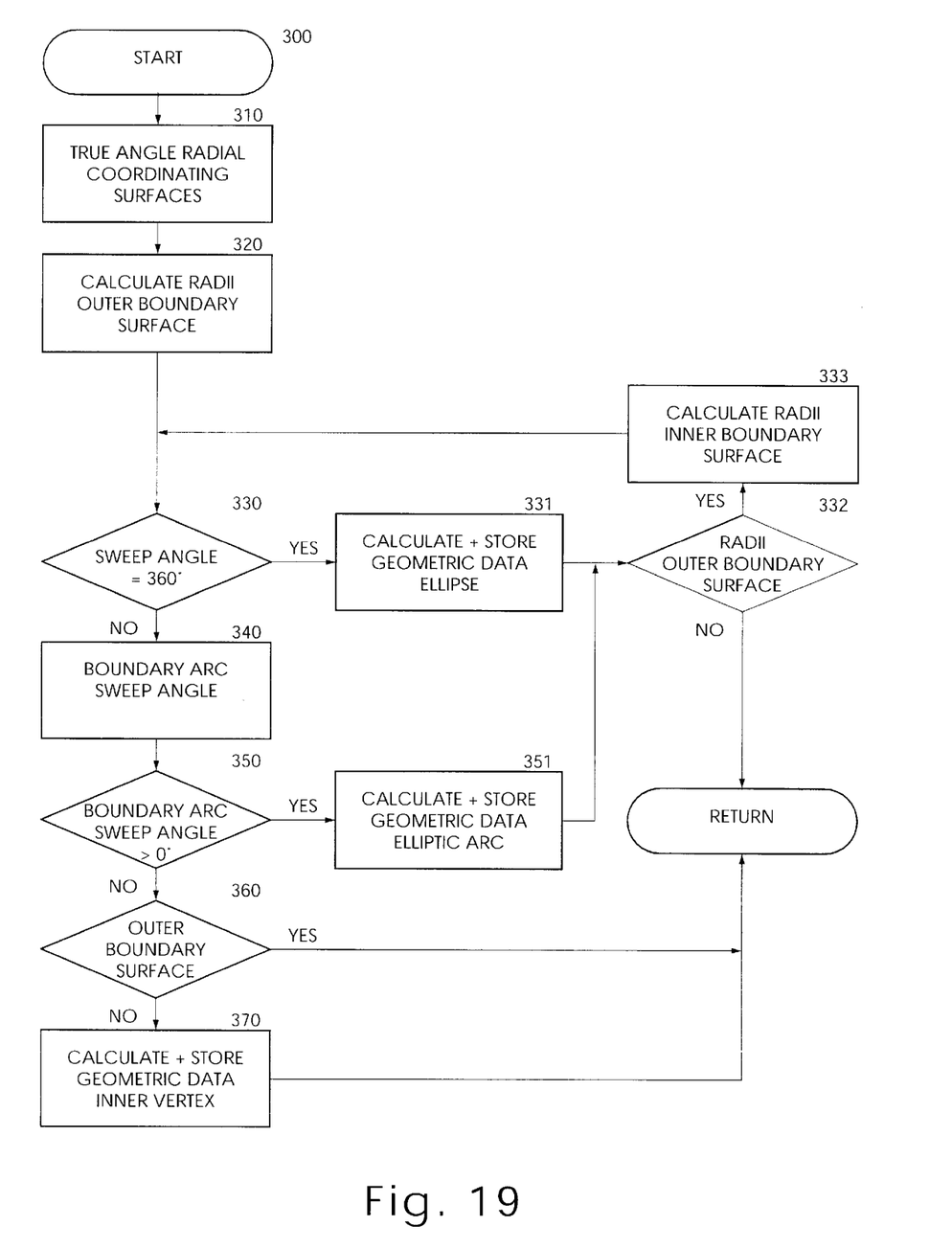
FIG. 19 is a schematic flowchart for a method for calculating the geometric data for elliptical segments, including a method for compensating for anamorphism according to the present invention.

FIG. 19 is a schematic flowchart to explain the calculation of the geometric data for an elliptical segment. The calculation includes compensations for anamorphism. The following variables are used in the explanation,
 XA=major radius of the outer tangential coordinating surface 70a;

YA=minor radius of the outer tangential coordinating surface 70a;

TA=margin of the outer tangential boundary surface;

XB=major radius of the inner tangential coordinating surface 70b;

YB=minor radius of the inner tangential coordinating surface 70b;

TB=margin of the inner tangential boundary surface;

XTA=major radius of the outer tangential boundary surface 72;

YTA=minor radius of the outer tangential boundary surface 72;

XTB=major radius of the inner tangential boundary surface 71;

YTB=minor radius of the inner tangential boundary surface 71;

O=aspect ratio of the major and the minor radius of the tangential coordinating surfaces 70a and 70b;

RM=initial angle RM of radial coordinating surface 86a.

RN=initial angle RN of radial coordinating surface 86b. Angle RN>RM;

RMN=angular difference between RM And RN;

RMO=calculated angle of the radial coordinating surface 86a;

RNO=calculated angle of the radial coordinating surface 86b;

R91=radial vector to vertex 91 with angle R91;

R92=radial vector to vertex 92 with angle R92;

R93=radial vector to vertex 93 with angle R93;

R94=radial vector to vertex 94 with angle R94;

S71=sweep angle of elliptical arc 71;

S72=sweep angle of elliptical arc 72

V12=single inner vertex 95.

In step 310, the program calculates an ellipticity transformation of the nominal angle of the radial coordinating surfaces, RMO=atn(O*tanRM);

RNO=atn(O*tanRN).

In step 320, the program calculates the major 110 and the minor 120 radius of the outer tangential boundary surface 72,

XTA=XA−TA;

YTA=YA−TA.

The compensation calculation process for the angle of the radial vectors to vertices 91, 92 and to vertices 93 and 94 is identical. Below the compensation process for the angle of the radial vector to vertices 93 and 94 is described. From that can be understood the compensation process for vertices 91 and 92.

In step 330, the program calculates and evaluates the sweep angle RMN,

RMN=RN−RM, if RMN=360• then the elliptical tangential boundary surface describes an ellipse and the dataflow continues at step 331. Otherwise, it proceeds to step 340.

In step 331, the program calculates and stores the geometric data of the ellipse.

In step 332, if the last calculated radii are for the outer tangential boundary surface then the dataflow continues at step 333. If there are more segments to calculate, then it returns to step 270.

In step 333, the program calculates the major 110 and the minor 120 radius of the inner tangential boundary surface 71, as follows:

XTB=XB+TB;

YTB=YB+TB.

In step 340, the program calculates the sweep angle (S71 and S72) of the boundary 71, arc 72, and includes ellipticity compensation for the angle of radial vectors R91, R92, R93, R94 to control anamorphism of vertices 91, 92, 93, 94. First the compensated angles of the radial vectors R93 and R94, respectively R91 and R92 are calculated, R93.1=a sin (R1/((XTA* sin RM)^2+7(YTA* cos RM)^2)^0.5.

R93.2=a sin (R1/((XTA* cos (RM+R93.1))^2+(YTA* sin (RM+R93.1)^2)^0.5.

R93=atn(XTA/YTA* tan (RMO+R93.2).

R94.1=asin (R1/((XTA* sin RN)^2+(YTA* cos RN)^2)^0.5.

R94.2=a sin (R1/((XTA* cos (RN−R94.1))^2 +(YTA* sin (RN−R94.1)^2)^0.5.

R94=atn(XTA/YTA* tan (RNO+R94.2).

Finally the compensated sweep angle for the elliptical arc of the radial boundary surfaces 72 respectively 71, is calculated,

S71=R92−R91

S72=R94−R93

In step 350, if the sweep angle S71 or S72>0•. then the dataflow continues at step 351. If not, it proceeds to step 360.

In step 351, the program calculates and stores the geometric data of the elliptical arcs 72 and 71.

In step 360, if the sweep angle is calculated for the outer boundary arc 72 then the dataflow returns to step 270, else the elliptical segment has three boundary surfaces and a single inner vertex (V12) and the dataflow continues at step 370.

Step 370, calculates and stores the geometric data of the single inner vertex V12,

V1=(RNO+RMO)/2;

V2=(RNO−RMO)/2;

B12=R1/sinV2.

The abscissa of V12=B12*cos V1;

the ordinate of V12=B12*sinV1;

next the dataflow returns to step 270.

It will be appreciated by those skilled in the art that various modifications and alterations can be made to the present invention without departing from the broad scope of the invention as defined by the attached claims. Some of these modifications have been discussed above, and others will be apparent to those skilled in the art. For example, while reference is made herein to a program, it will be appreciated that any hardware platform would be appropriate, provided it has sufficient computational power and memory.

I claim:

1. A computer graphics system for displaying objects having elliptical segments that are bounded by linear radial and elliptical tangential elements, said system comprising:

a means to retrieve a parametric model of an object having elliptical segments, said elliptical segments having boundary surfaces which intersect at vertices, and which have a common origin;

a means to specify a location, size and orientation to display said object on a display;

a means to determine the locations of said vertices relative to said common origin according to said specified location, size and orientation;

a means to evaluate said determined locations to identify valid and invalid vertices and segment geometries;

a means to examine invalid segment geometries to determine segments with geometries that cannot be corrected and to remove such segments from consideration when drawing the object;

a means to determine for each invalid segment geometry which can be corrected, at least one new valid vertex for each said segment to replace two invalid vertices of said segment to render said segment geometry valid; and a means to draw said object on said display with said segments employing said valid vertices according to said specified location, size and orientation to provide a substantially dimensionally accurate and geometrically undistorted output.

2. A computer graphics system as claimed in claim 1 wherein said system further comprises:

a user interface which permits a user to set one or more attribute values for said model and wherein said means to determine said locations of said vertices determines said locations in correspondence with said set attribute values.

3. A computer graphics system as claimed in claim 1 wherein said means to determine said locations of said vertices comprises evaluating an ellipticity transformation of an angle of linear radial coordinating surfaces of said elliptical segments.

4. A computer graphics system as claimed in claim 3 wherein said elliptical segments have outer and inner tangential boundary surfaces and said means to determine said locations of said vertices determines a major and a minor radius of said boundary surfaces.

5. A computer graphics system as claimed in claim 4 wherein said means to determine said locations evaluates a sweep angle to determine if a segment is a torus.

6. A computer graphics system as claimed in claim 5 wherein said means to determine said locations of said vertices determines a compensated angle for each radial vector extending from said common origin to each vertex of a segment.

7. A computer graphics system as claimed in claim 1 wherein said means to evaluate said determined locations compares said determined locations to a predefined set of geometric rules to identify invalid segment geometries.

8. A method of displaying a three dimensional object including elliptical segments that are bounded by linear radial and elliptical tangential elements, said elliptical segments having boundary surfaces which intersect at vertices and which have a common origin, said object being defined as a parametric model, comprising the steps of:

(i) selecting an object to be displayed;

(ii) selecting a display location, orientation and size for said selected object;

(iii) determining the locations of said vertices of said object relative to said common origin according to said display location, orientation and size;

(iv) evaluating said determined locations to identify valid and invalid vertices and segment geometries;

(v) examining invalid segment geometries to determine segments with geometries that cannot be corrected and to remove such segments from consideration when drawing the object;

(vi) determining, for each invalid segment geometry which can be corrected, at least one new valid vertex for each said segment to replace two invalid vertices of said segment to render said segment geometry valid; and (vii) drawing said object on said display with said valid vertices according to said specified location, orientation and size to provide a substantially dimensionally accurate and geometrically undistorted output.

9. The method claimed in claim 8 where in step (iii) a compensated angle is also determined for each radial vector extending from said common origin to each vertex of a segment.

* * * * *